United States Patent
Park et al.

(10) Patent No.: US 9,225,306 B2
(45) Date of Patent: *Dec. 29, 2015

(54) GAIN CONTROL FOR AN ELECTRO-ACOUSTIC DEVICE WITH A FACIAL MOVEMENT DETECTOR

(71) Applicant: QUALCOMM Incorporated, San Diego, CA (US)

(72) Inventors: Kee-Hyun Park, Delmar, CA (US); Kuntal Dilipsinh Sampat, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/542,747

(22) Filed: Nov. 17, 2014

(65) Prior Publication Data

US 2015/0086052 A1 Mar. 26, 2015

Related U.S. Application Data

(63) Continuation of application No. 14/015,390, filed on Aug. 30, 2013, now Pat. No. 9,048,798.

(51) Int. Cl.
| | |
|---|---|
| *H04R 25/00* | (2006.01) |
| *H03G 3/00* | (2006.01) |
| *H04S 7/00* | (2006.01) |

(52) U.S. Cl.
CPC .................. *H03G 3/00* (2013.01); *H04R 25/00* (2013.01); *H04R 25/48* (2013.01); *H04S 7/304* (2013.01)

(58) Field of Classification Search
CPC .................................. H04R 25/00; H03G 3/00
USPC ............ 381/23.1, 26, 92, 312, 313, 316, 319, 381/321
See application file for complete search history.

(56) References Cited

U.S. PATENT DOCUMENTS

| | | | |
|---|---|---|---|
| 5,629,985 A * | 5/1997 | Thompson ................... | 381/312 |
| 6,021,207 A | 2/2000 | Puthuff et al. | |
| 8,259,972 B2 | 9/2012 | Hockley | |
| 8,300,861 B2 | 10/2012 | Pontoppidan | |
| 9,048,798 B2 | 6/2015 | Park et al. | |
| 2011/0091056 A1* | 4/2011 | Nishizaki et al. ............. | 381/312 |
| 2011/0261983 A1 | 10/2011 | Claussen et al. | |
| 2012/0114155 A1 | 5/2012 | Nishizaki et al. | |
| 2012/0114156 A1* | 5/2012 | Serman et al. ................ | 381/314 |
| 2012/0243715 A1 | 9/2012 | Pedersen | |
| 2012/0275630 A1 | 11/2012 | Hannemann et al. | |
| 2013/0223660 A1 | 8/2013 | Olafsson et al. | |
| 2014/0029762 A1* | 1/2014 | Xie et al. ..................... | 381/94.1 |

* cited by examiner

*Primary Examiner* — Tuan D Nguyen
(74) *Attorney, Agent, or Firm* — The Marbury Law Group, PLLC

(57) ABSTRACT

Methods, systems and devices are provided for controlling a wearable device. Embodiments include receiving a facial movement indication from a facial movement detector measured contemporaneously with an input audio signal. Additionally, whether a first movement pattern associated with the wearer speaking is a movement match to the facial movement indication may be determined. In this way, a speaking gain profile may be applied to the input audio signal for generating an augmented audio segment in response to determining the first movement pattern is the movement match to the facial movement indication. Thus, the augmented audio segment may be output.

30 Claims, 7 Drawing Sheets

GAIN CONTROL FOR AN ELECTRO-ACOUSTIC DEVICE WITH A FACIAL MOVEMENT DETECTOR

RELATED APPLICATIONS

This application claims the benefit of priority to U.S. Nonprovisional patent application Ser. No. 14/015,390 entitled "Gain Control for a Hearing Aid with a Facial Movement Detector" filed Aug. 30, 2013, the entire contents of which are hereby incorporated by reference for all purposes.

BACKGROUND

Hearing loss is generally caused by sensorineural hearing loss, conductive hearing loss or a combination of the two. Sensorineural hearing loss, occurs when there is damage to the inner ear (i.e., the cochlea) or to the nerve pathways from the inner ear to the brain. Sensorineural hearing loss is not generally correctable using medicines or surgery and is unfortunately the most common type of permanent hearing loss. Conductive hearing loss occurs when sound is not conducted efficiently through the outer ear canal to the eardrum and the tiny bones (ossicles) of the middle ear. Conductive hearing loss usually causes a reduction in sound level or the ability to hear faint sounds. Unlike sensorineural, conductive hearing loss can often be corrected medically and/or surgically.

Sensorineural hearing loss is the most common type of hearing loss among adults (occurring in 80 percent of adult hearing loss cases). Although sensorineural hearing loss is not often medically or surgically treatable, the use of hearing aids often helps. However, contemporary hearing aids do not work very well at helping the wearer hear sounds when the wearer himself is speaking, since the speaker's own sounds tend to get over amplified. The over amplification is due in part to natural phenomenon that occurs when the ear canal is blocked (particularly by a hearing aid). People with normal hearing can simulate this phenomenon by placing a finger in an ear and listening to their own speech. To address this issue, one approach is to providing venting holes in the part of a hearing aid that gets inserted in the ear canal. Another approach lowers the output gain of the hearing aid in lower frequencies, which correspond to the added sound heard by the wearer when he or she is speaking. However, these approaches often reduce the effectiveness of the hearing aid when the user is not talking.

SUMMARY

The various embodiments described herein include methods, systems and devices for controlling the output of a hearing aid worn by a wearer based on whether the wearer is speaking as determined by facial movement sensors. The audio output of the hearing aid may be controlled to amplify an audio signal received by a microphone based on a facial movement indication received from a facial movement detector measured contemporaneously with the input audio signal. A first gain profile may be applied to the input audio signal for adjusting or generating an augmented audio segment in response to determining that facial movements match a stored facial movement pattern correlated to the wearer speaking. Also, a second gain profile may be applied to the input audio signal for generating the augmented audio segment in response to determining that facial movements do not match a stored facial movement pattern correlated to the wearer speaking. In an embodiment, a user selection input may be received indicating whether the first gain profile should be applied, and the first gain profile may be applied to the input audio signal when the selection input indicates the first gain profile should be applied and the second gain profile may be applied to the input audio signal when the selection input indicates that the first gain profile should not be applied.

Further embodiments may include a hearing aid having a processor configured with processor-executable software instructions to perform various operations corresponding to the methods discussed above.

Further embodiments may include a hearing aid having various means for performing functions corresponding to the method operations discussed above.

Further embodiments may include a non-transitory processor-readable storage medium having stored thereon processor-executable instructions configured to cause a processor to perform various operations corresponding to the method operations discussed above.

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims. Alternate embodiments may be devised without departing from the scope of the disclosure. Additionally, well-known elements of the disclosure will not be described in detail or will be omitted so as not to obscure the relevant details of the disclosure.

The word "exemplary" is used herein to mean "serving as an example, instance, or illustration." Any implementation described herein as "exemplary" is not necessarily to be construed as preferred or advantageous over other implementations. Additionally, use of the words, "first," "second," "third," "primary," "secondary," "tertiary" or similar verbiage is intended herein for clarity purposes to distinguish various described elements and is not intended to limit the invention to a particular order or hierarchy of elements.

The various embodiments relate to improving the output sound of hearing aids by applying different gain profiles to an output of a hearing aid based on whether the user is speaking or not. The hearing aid may use one or more facial movement detectors, such as an electromyography sensor (EMG sensor), to detect facial movements that correspond to the user speaking. Also, one or more microphones may be used to detect whether the input audio signals detected by the hearing aid correspond to recognizable voice patterns of the wearer. Based on determinations made from muscle activity indicated from the facial movement detector and/or the input audio signal from the microphone, an appropriate gain profile may be applied to the input audio signal. In this way, the hearing aid output sound is adjusted based on the determinations made corresponding to one or more indications the wearer may be speaking.

Figure 1:
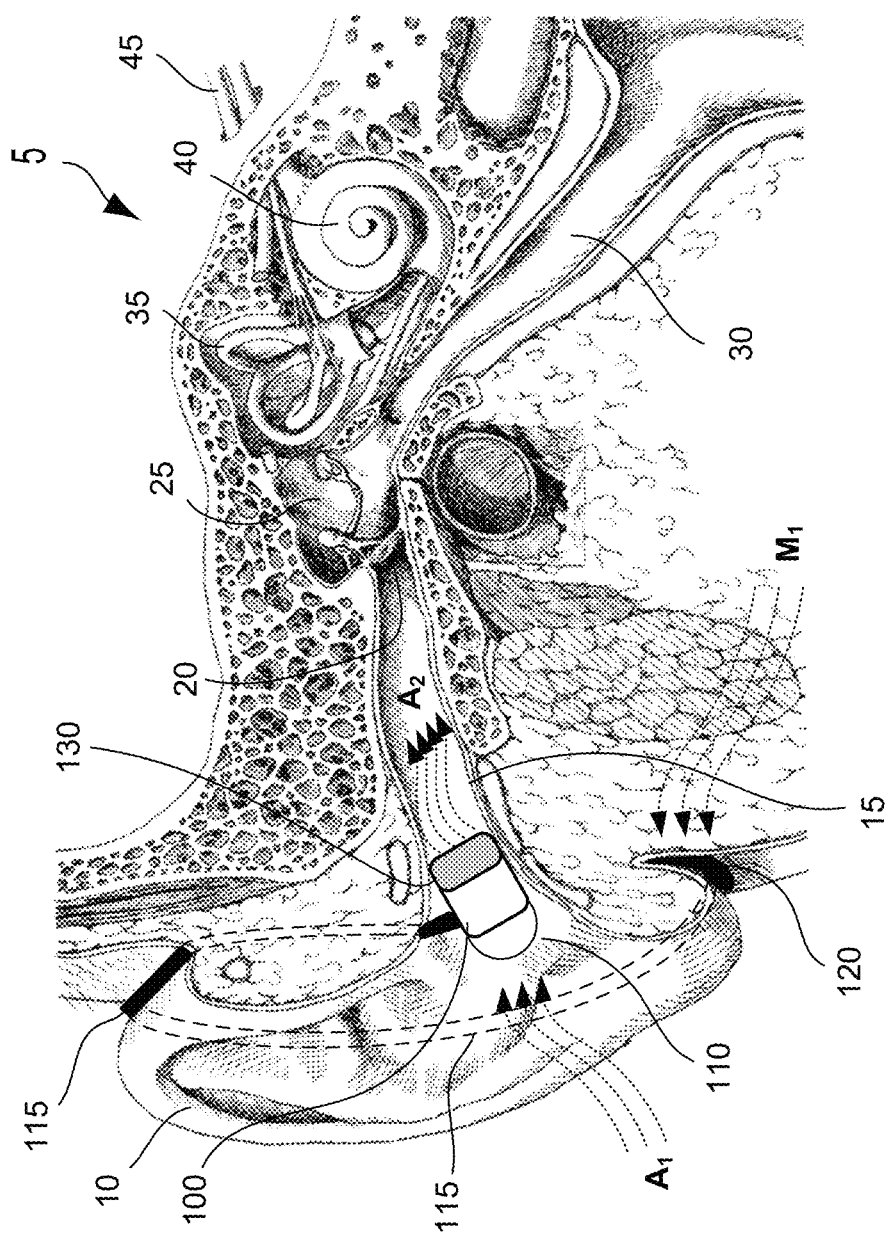
FIG. 1 illustrates a partial cross-sectional view of a human auditory system and a hearing aid suitable for use in the various embodiments.

FIG. 1 illustrates a partial cross-sectional view of a representative human auditory system 5 in conjunction with a hearing aid 100 suitable for use in the various embodiments. Each ear that is part of the typical human auditory system 5 includes the pinna 10 (i.e., the externally protruding parts of the ear, including the lobes) an ear canal 15, which are part of the outer ear. Damage to portions of the outer ear and/or problems with how the ear canal 15 conducts sounds may result in conductive hearing loss. The ear canal 15 extends from the outermost parts of the ear to the tympanic membrane 20 (also referred to as the ear drum), which forms part of the middle ear that includes ossicles 25 and joins to the Eustachian tube 30. The inner ear includes semicircular canals 35, a cochlea 40 and the auditory nerve 45. Damage to the inner ear is common with sensorineural hearing loss.

Also shown in FIG. 1 is a hearing aid 100, which includes a microphone 110, an ear hook 115, a facial movement detector 120 and a speaker 130. The hearing aid 100 may be formed, enhanced and/or sized to conform to the shape of a portion of the wearer's ear. The microphone 110 receives an input audio signal $A_1$, cause by sounds generated in the surrounding environment. Also, the microphone 110 may include more than one microphone for picking up sounds from different directions, such as those sounds coming from the wearer, as compared to sounds from another source. Elements such as the ear hook 115 are optional. The facial movement detector 120 may be configured to engage a portion of the wearer's skin suitable for detecting facial movements, particularly muscle movements, associated with speaking. In this way, the facial movement detector 120 may be configured to detect signals $M_1$ generated by facial muscles when the wearer is speaking. In this way, facial movements not associated with the wearer speaking, such as eating, drinking, chewing or even certain silent facial expressions, may be distinguished from facial movements associated with speech. The speaker 130 may be configured to output the augmented sound $A_2$ generated by the hearing aid 100 in accordance with the various embodiments. The hearing aid 100 may further include one or more processors (not shown) configured with processor-executable instructions to perform operations as disclosed herein. The processor(s) may be coupled to the microphone 110, the facial movement detector 120 and the speaker 130, in order to receive inputs $A_1$, $M_1$ and generates an output sound $A_2$ for the wearer's auditory system 5 to more easily and clearly hear.

As used herein, the term "hearing aid" refers to an electro-acoustic device, which typically fits in or behind a wearer's ear, and may be designed to amplify and modulate sound for the wearer. The hearing aid, as referred to herein adds a certain level of gain to the incoming sound to generate an augmented sound for the wearer to hear. The incoming sound may include an input audio signal, all or a portion of which may be analyzed by a hearing aid processor. The gain or level of gain may be the amount of sound added by the hearing aid. Gain as used herein refers to the difference between a hearing aid's input level and the output level, which levels may be measured in decibels. A hearing aid may apply a gain to incoming sounds (received as an input audio signal) in order to generate a louder and/or modified output sound. An input audio signal may be a representation of sound, such as an electrical voltage, generally having multiple frequencies. Sound refers to a mechanical wave that is an oscillation of pressure. For humans the audible range of sound frequencies generally ranges from 16 Hz to 20,000 Hz. Differing levels of gain may be added to different frequencies of the input audio signal. In this way, frequencies in which the user has difficulty hearing may have more gain applied than other frequencies. A gain profile refers to a set of data correlating ranges of sound frequencies to varying levels of gain.

As used herein, the terms "microphone" or "hearing aid microphone" are used interchangeably herein and refer to an input transducer of a hearing aid that picks up sound (one or more input audio signals) from the immediately surrounding environment and converts it into an electrical signal, which it directs to a processor/amplifier for amplification and/or modulation.

As used herein, the term "facial movement detector" refers to a sensor capable of detecting facial movement, particularly those facial movements associated with a hearing aid wearer speaking. A facial movement detector may be able to receive a facial movement indication, which is a representation of the movement of facial muscles and/or the surface skin associated with the movements of the face. In the various embodiments, the facial movement detector may be particularly suited and/or situated to detect facial movement associated with speaking. An exemplary facial movement detector in accordance with an embodiment is an electromyography (EMG) sensor. EMG is a technique for evaluating and recording the electrical activity produced by skeletal muscles. An EMG sensor may detect signals in the form of the electrical potential generated by muscle cells when these cells are electrically or neurologically activated. The signals may be analyzed to detect biomechanics of human, such as jaw movements corresponding to a person speaking. A facial EMG may measure facial movement activity by detecting and amplifying the tiny electrical impulses that are generated by facial muscle fibers when they contract. Another form of facial movement detector may include one or more conductive textile electrodes placed in contact with the skin, which may detect changes caused by muscle motion, tissue displacement and/or electrode deformation. A further facial movement detector may be a pressure sensor configured to detect skin surface changes, particularly at or near the wearer's jaw. Further still, another microphone configured to detect sound conducted through the wearer's facial tissue, including bones, may be used as a facial movement detector.

As used herein, the term "speaker" or "receiver" are used interchangeably herein and refer to a component of a hearing aid that changes electrical signals from the processor/amplifier into sound, which is generally directed into the ear of the wearer.

Figure 2:
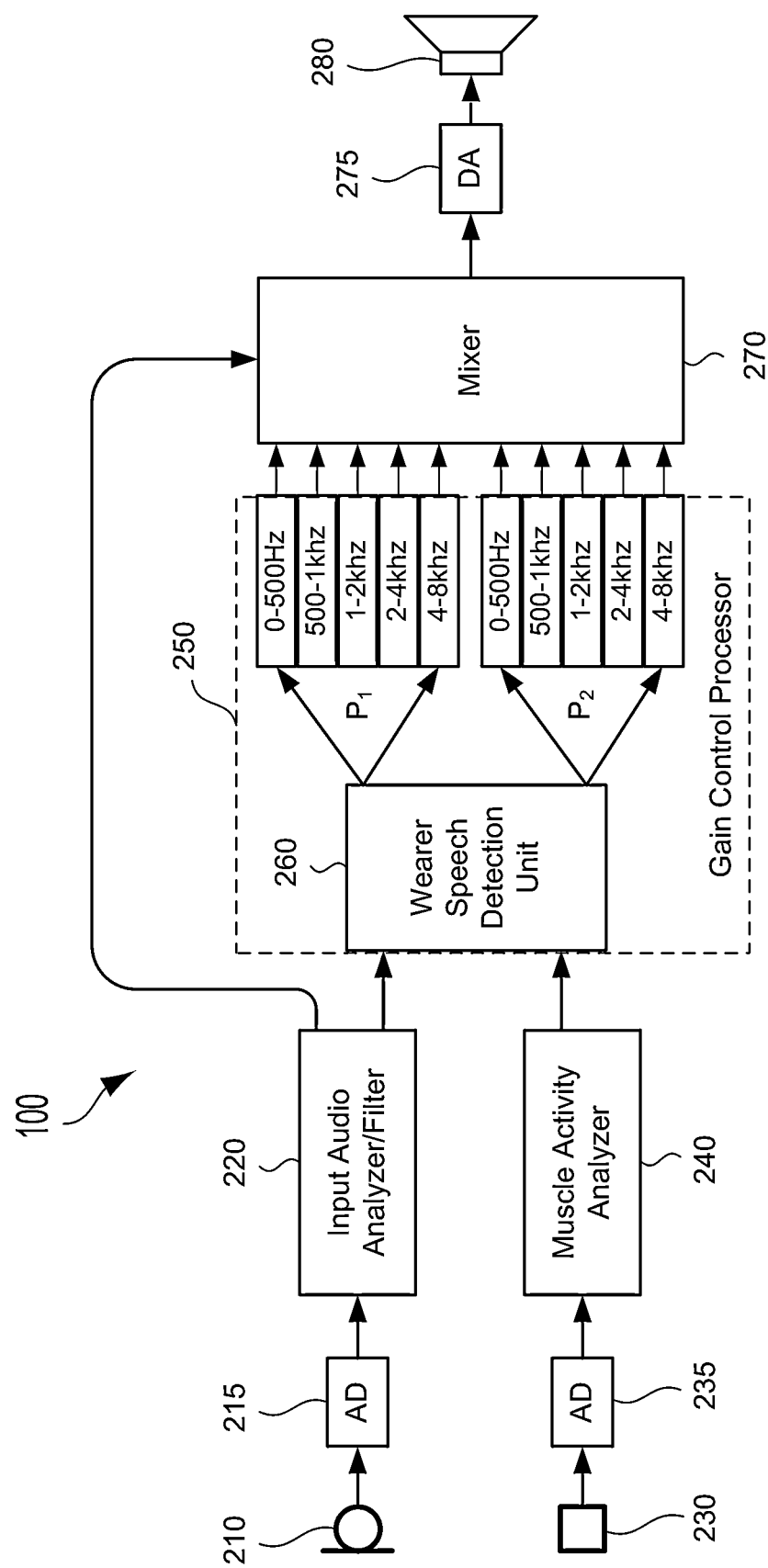
FIG. 2 illustrates a schematic block diagram of a hearing aid suitable for the various embodiments.

FIG. 2 illustrates an embodiment schematic block diagram of the electronic components of a hearing aid 100. As above, the hearing aid 100 includes microphone 210 for receiving input audio signals. The microphone 210 may include more than one microphone. For example, a first microphone may be configured on the hearing aid to more readily pick up sounds from the wearer's own mouth, while a second microphone may be configured to primarily pick up other ambient sounds. Otherwise, the microphone 210 serves the traditional function of receiving audio signals, which may be processed through an analog/digital (AD) converter 215 for digital processing of the detected/received signals. The received ambient audio signal may then be processed as one or more input audio signals through an Input Audio Analyzer/Filter (IAAF) 220.

The IAAF 220 may be a unit that detects whether a voice is present in an input audio signal. In particular, the IAAF 220 may be configured to specifically detect the wearer's own voice by applying frequency analysis to determine one or more fundamental frequencies of the received electrical signal. Thus, the IAAF 220 may act as a voice detector by comparing the electric (i.e., digitized) representation of the acoustic input sounds to one or more sets of frequency patterns correlated to human speech. Particularly, as part of the setup of the IAAF 220 and the overall hearing aid 100, frequency patterns of the wearer's own speech may be stored in an operatively coupled memory for comparison and matching to the digitized acoustic input signal. Alternatively, the presence of synchronous patterns and harmonic structures of the sounds associated with one or more designated languages, words and/or even letters may be used to identify voice activity. In this way, the IAAF 220 may determine whether at least a portion of the input audio signal, such as characteristics represented by an input audio signal pattern, is a match to similar characteristics of a first voice pattern associated with speech generated by the wearer. A match of an input audio signal with a voice pattern means the two patterns (each representing an audio signal) are substantially equivalent. Additionally, the IAAF 220 may serve as a filter, identifying predefined sounds, undesirable noises and/or patterns (collectively referred to as "noise") for which the hearing aid need not apply a gain. The portion of the input audio signal identified to be noise may bypass the Gain Control Processor 250 and be sent directly to the mixer 270 for output. In this way, those portions identified as "noise" may still be output by the hearing aid, but not necessarily amplified or even attenuated. Otherwise, those other portions of the input audio signal not considered noise may be forwarded to the Gain Control Processor 250, along with any indication as to whether any subportion thereof has been identified as human speech and/or the wearer's speech. Alternatively, those portions identified as "noise" may be attenuated by the mixer or filtered out entirely.

Additionally, the hearing aid 100 may include a facial movement detector 230 for receiving facial movement indications, particularly from facial muscles. For example, an EMG sensor that may include surface electrodes for measuring a voltage differential, may serve as a facial movement detector 230. A facial movement detector 230 may be located in direct contact with the hearing aid wearer's skin. For example, the facial movement detector 230 may be positioned on an external portion of the hearing aid 100 in contact with facial regions whose movement is associated with speaking. The facial movement detector 230 may include more than one facial movement detector in order to detect/differentiate patterns of facial movement and/or to provide redundancies to ensure movement is detected. For example, a first facial movement detector may be disposed on a first part of the hearing aid, while a second facial movement detector may be disposed remote from the first facial movement detector on a second part of the hearing aid or even remote from the main hearing aid body. Otherwise, the facial movement detector 230 serves to receive facial movement indications, which may be processed through an analog/digital (AD) converter 235 for digital processing of the signals representing those facial movement indications. The received facial movement indications may then be processed as one or more input signals through a Muscle Activity Analyzer (MAA) 240.

The MAA 240 may be a unit that amplifies, decomposes and processes the received facial movement indications. For example, measured EMG signals may be decomposed and processed into their constituent motor unit action potentials, some of which may have particular characteristics associated with muscle movements associated with speech. Additionally, the MAA 240 may analyze those processed facial movement indications, by isolating those portions relevant to recognizing when the hearing aid wearer is speaking. In particular, the MAA 240 may act as a speech detector by being configured to specifically detect which jaw muscle movements are associated with speech. The MAA 240 may compare the electric (i.e., digitized) representation of facial movements (i.e., a facial movement indication) to one or more sets of patterns generally correlated to facial movements during human speech. A more customized analysis may compare the detected patterns to previously recorded movements of a particular wearer while speaking. As part of the setup of the MAA 240 and the overall hearing aid 100, facial movement patterns of the wearer, while speaking, may be stored in an operatively coupled memory for comparison and matching to the received facial movement indication. Facial movement patterns may be measured by sensors, converted into a signal, which will have its own representative pattern of the actual facial movement pattern, and stored and/or analyzed. Alternatively, the presence of generic patterns associated with human speech may be used to identify movement patterns indicative of the wearer speaking. The determination as to whether the facial movement indication matches (i.e., is a movement match) one or more predefined (stored) movement patterns associated with the wearer speaking may be forwarded to the Gain Control Processor 250. A match of a facial movement indication (based on its representative pattern), received from a facial movement detector, to a stored facial movement pattern means the two patterns (each representing facial movement associated with a wearer speaking) are substantially equivalent.

The Gain Control Processor (GCP) 250 may be a processor capable of properly sorting and/or analyzing the signals from the IAAF 220 and/or the MAA 240. In an embodiment, the IAAF 220 and/or the MAA 240 may deliver raw or only partially processed signals to the GCP 250, in which case the GCP may further process those signals. In fact, many or most of the functions of the IAAF 220 and/or the MAA 240 may be performed by the GCP 250 and particularly a Wearer Speech Detection Unit (WSPU) 260 that may be part of the overall GCP 250. Thus, the WSPU 260 may receive both the input audio signal and the facial movement indication in order to determine whether the facial movement indication is a movement match to a first movement pattern associated with the wearer speaking. Additionally, the WSPU 260 may determine whether at least a portion of the input audio signal is an audio match to a first voice pattern associated with speech generated by the wearer. Based upon the received inputs, the WSDU 260 may determine whether to apply a first gain profile $P_1$ or a second gain profile $P_2$ to an entire input audio signal or portions thereof. The first gain profile $P_1$ may be applied when it is determined that the wearer is speaking; while the second gain profile $P_2$ may be applied when it is determined that the wearer is not speaking. As described further below, each of the first gain profile $P_1$ or a second gain profile $P_2$ may be further broken down across various frequency ranges. In this way the gain applied to incoming sound is further varied depending upon what frequency ranges are present.

The hearing aid 100 may further include a mixer 270 for combining and changing the output level of the original input audio signal based upon the applied gain profiles, if applicable. Additional gain may be applied by the mixer 270 based on detected levels of noise received from the IAAF 220. In this way, all or portions of the input audio signal may be enhanced for outputting an augmented audio segment suitable to the needs of a hearing aid wearer. The augmented audio segment may include various portions and/or frequencies that have been enhanced in varied ways based on the appropriate gain profiles applied. In this way, the augmented audio segment may include one distinct portion of the original input audio signal that has been changed differently than another distinct portion by have different gain profiles applied thereto. The output signal generated by the mixer 270 may be processed through a digital-to-analog converter (DA) 275 for converting a digitized signal to an analog output signal, if appropriate. In this way, the augmented audio segment may be output to the wearer of the hearing aid from the speaker 280.

Figure 3:
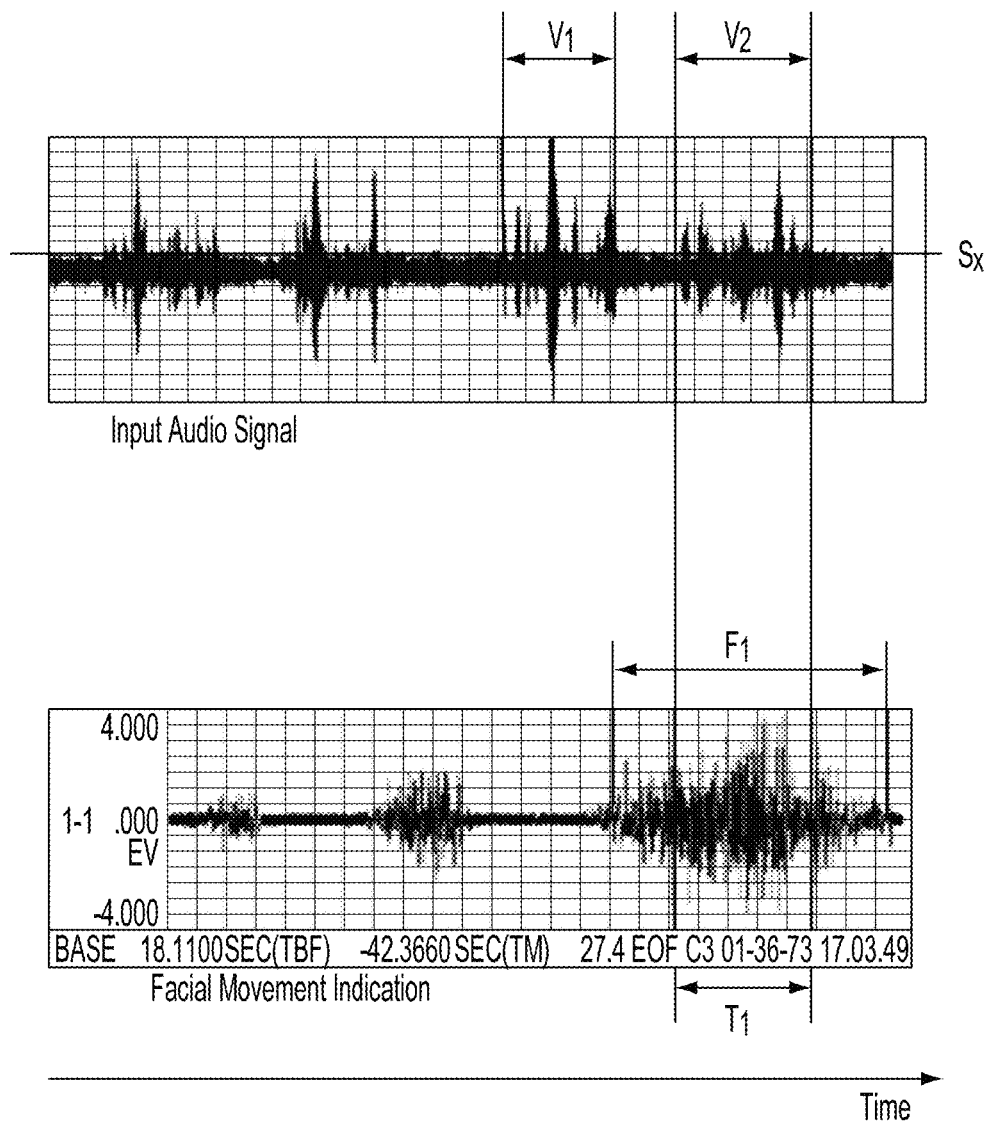
FIG. 3 illustrates comparative graphs of data received from a microphone and an EMG sensor.

FIG. 3 illustrates representative patterns of processed inputs from the microphone 210 and the facial movement detector 230 measured over a period of time. The upper graph particularly represents the processed input audio signal detected by the microphone 210. The lower graph represents the processed facial movement indication detected by the facial movement detector 230, which in this illustration is from an EMG sensor. The upper and lower graphs run contemporaneously, meaning they represent separate inputs occurring in the same period of time. In this way, the patterns or portions of the patterns may be correlated in time, such that certain portions of the input audio signal may be linked to corresponding portions of the facial movement indications.

The input audio signal includes a measureable noise level $S_x$, as well as a number of patterns that may be analyzed and compared to known patterns associated with speech. A voice pattern as used herein refers to an arrangement or sequence within the representation of an input audio signal that is discernible and may be compared to known patterns of sound associated with human speech or a particular individual's speech. In fact, the illustrated input audio signal includes two portions $V_1$, $V_2$ that match voice patterns associated with speech. The input audio signal need not include any patterns that match voice patterns, but if it does preferably it may be identified and determined to be a match. It should be understood that each of the two portions $V_1$, $V_2$ may individually be considered a separate recognizable voice pattern. Although the first voice pattern $V_1$ and the second voice pattern $V_2$ are shown as being spaced apart, they may be consecutive and/or in reverse order (i.e., $V_2$ before $V_1$). Numerous other voice patterns that may be associated with speech may also be available for comparison of further input audio signals. As noted above, the two voice patterns $V_1$, $V_2$ may be generic voice patterns associated with human speech. Alternatively, matching patterns may be limited to voice patterns specifically correlated to a particular hearing aid wearer's speech. Regardless, this pattern matching illustrates a means of determining whether at least a portion of an input audio signal matches a first voice pattern associated with speech generated by the wearer.

The lower graph also includes patterns that may be recognizable, which as with the input audio signal may be analyzed and compared to known movement patterns associated with speech. A movement pattern as used herein refers to an arrangement or sequence within the representation of a facial movement indication that is discernible and may be compared to known patterns of movement associated with human speech or a particular individual's speech. The illustrated facial movement indication includes a portion $F_1$ that is a match to a movement pattern associated with speaking (i.e., a movement match). It should be understood that the facial movement indication may not include a portion that matches any movement pattern associated with speaking. Also, the facial movement indication may include more than one portion that matches a speaker's movement pattern. Preferably, the matching movement pattern $F_1$ is not just associated with any human speaking, but more specifically associated with the wearer of the hearing aid speaking. Consequently, this further pattern matching illustrates a means of determining whether at least a portion of a received facial movement indication is a movement match to a first movement pattern associated with speech generated by the wearer.

Thus, the GCP 250 and/or the WSPU 260 receiving the processed or semi-processed information regarding the input audio signal and the facial movement indication may determine what gain profile to apply for generating an output sound that is more readily heard/recognized by the wearer. If based on the analyzed input it is determined the wearer is speaking, then a first gain profile may be applied to the input audio signal. However, if based on the analyzed input it is determined the wearer is not speaking, then a second gain profile may be applied to the input audio signal. In an embodiment, a first gain profile may be applied to the input audio signal for generating an augmented audio segment in response to only determining the facial movement indication, contemporaneously measured with that input audio signal, is a movement match to the first movement pattern $F_1$. Alternatively, applying the first gain profile may be further in response to determining the input audio signal is an audio match to the first voice pattern. This aspect is shown in FIG. 3, where only a portion of the matching movement pattern $F_1$ of the facial movement indication occurs contemporaneously with the second matching voice pattern $V_2$. Accordingly, a first gain profile may be applied to that portion of the input audio signal occurring during the overlapping segment of time $T_1$ and a second gain profile may be applied to the portions of the input audio signal occurring outside the overlapping segment of time $T_1$.

Figure 4A:
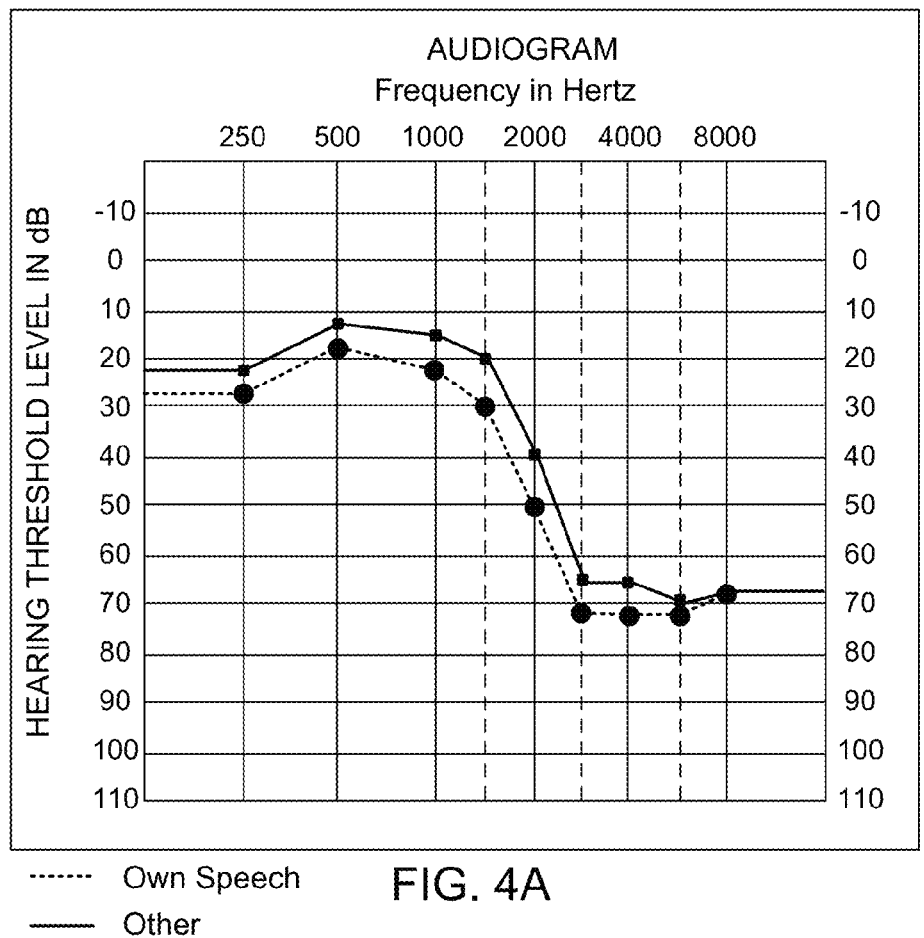
FIG. 4A illustrates comparative audiogram profile representing level of hearing loss based on a subject hearing "own speech" versus hearing everything else.
Figure 4B:
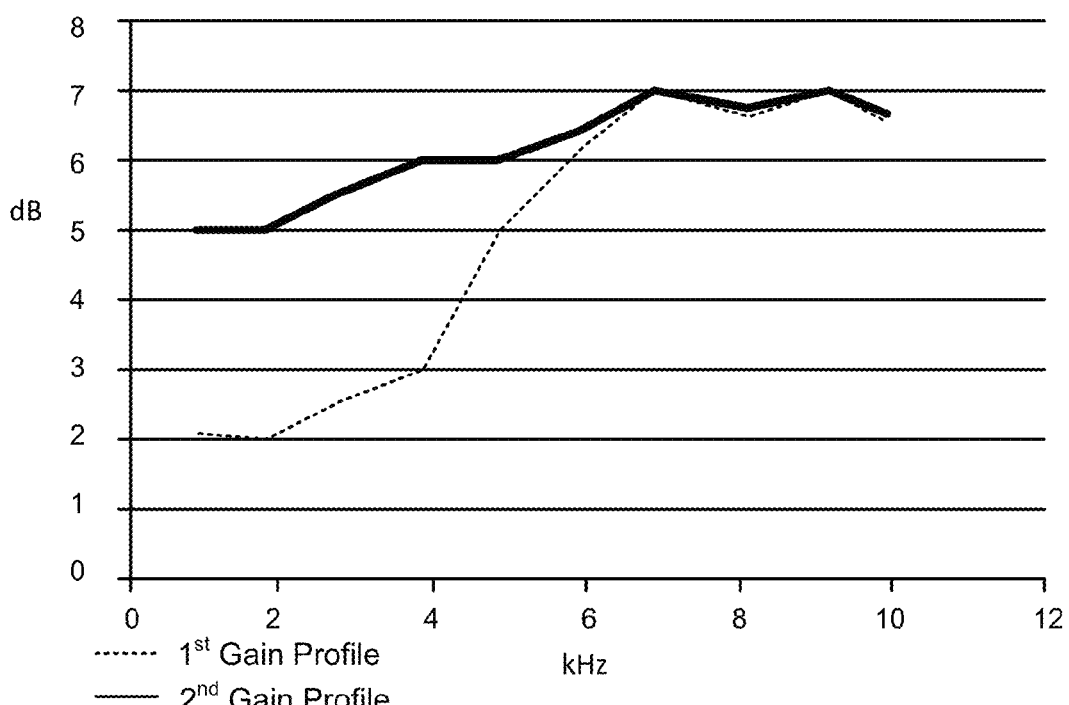
FIG. 4B illustrates comparative gain profiles corresponding to the audiogram profiles of FIG. 4A.

The set or sets of data used to develop an appropriate gain profile for a hearing aid is/are generally derived from an audiogram determined from testing conducted on the person needing the hearing aid. FIG. 4A illustrates an audiogram showing separate hearing threshold levels across various frequencies. One audiogram profile (indicated as "Own Speech") represents the subject's hearing threshold levels when hearing himself speak. The other audiogram profile (indicated as "Other") represents the subject's hearing threshold levels when hearing sounds other than his own speech, including hearing others speak. In this example, both profiles include varying degrees of significant hearing loss in the middle frequencies and even more hearing loss in the higher frequencies. Thus, this individual may benefit from having a correspondingly higher level of gain applied to those middle and higher level frequency portions of an input audio signal. Additionally, in accordance with an embodiment this individual may further benefit a first gain profile applied when he is listening to himself speak and a second gain profile when he is not speaking. FIG. 4B illustrates first ($1^{st}$) and second ($2^{nd}$) gain profiles, respectively corresponding to the "own speech" and "other" scenarios from FIG. 4A. Each of the gain profiles includes a set of gain values corresponding to multiple frequencies of the input audio signal. In this way, the "own speech" may include a first set of gain values and the "other" may include a second set of gain values. As shown this individual needs less gain applied in the lower frequencies when hearing himself speak.

Figure 5:
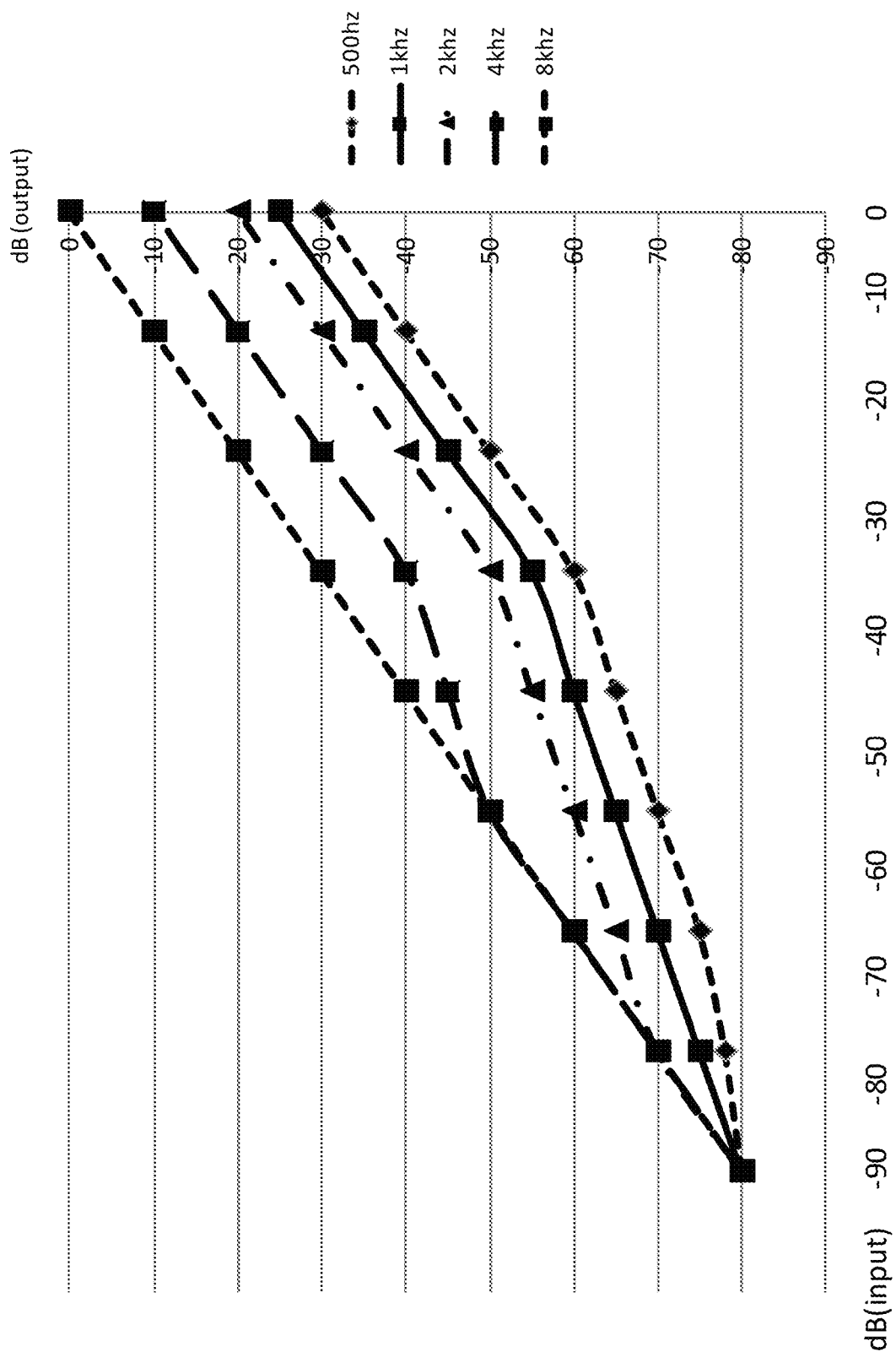
FIG. 5 illustrates a graph with gain profiles for varied frequency bands, suitable for use in the various embodiments.

In an embodiment, the gain profiles may be further broken down across ranges of the audible frequency spectrum. FIG. 5 illustrates frequency-dependent gain distributions for five different consecutive frequency ranges, corresponding to 500 Hz, 1 kHz, 2 kHz, 4 kHz and 8 kHz. These frequency-dependent gain distributions correlate an output decibel level generated for each frequency range depending upon its corresponding input decibel level. These five frequency-dependent gain distributions may all be associated with the same gain profile, since each one applies to different frequencies. Thus, a similar but somewhat different set of frequency-dependent gain distributions may be provided for a different gain profile.

Figure 6:
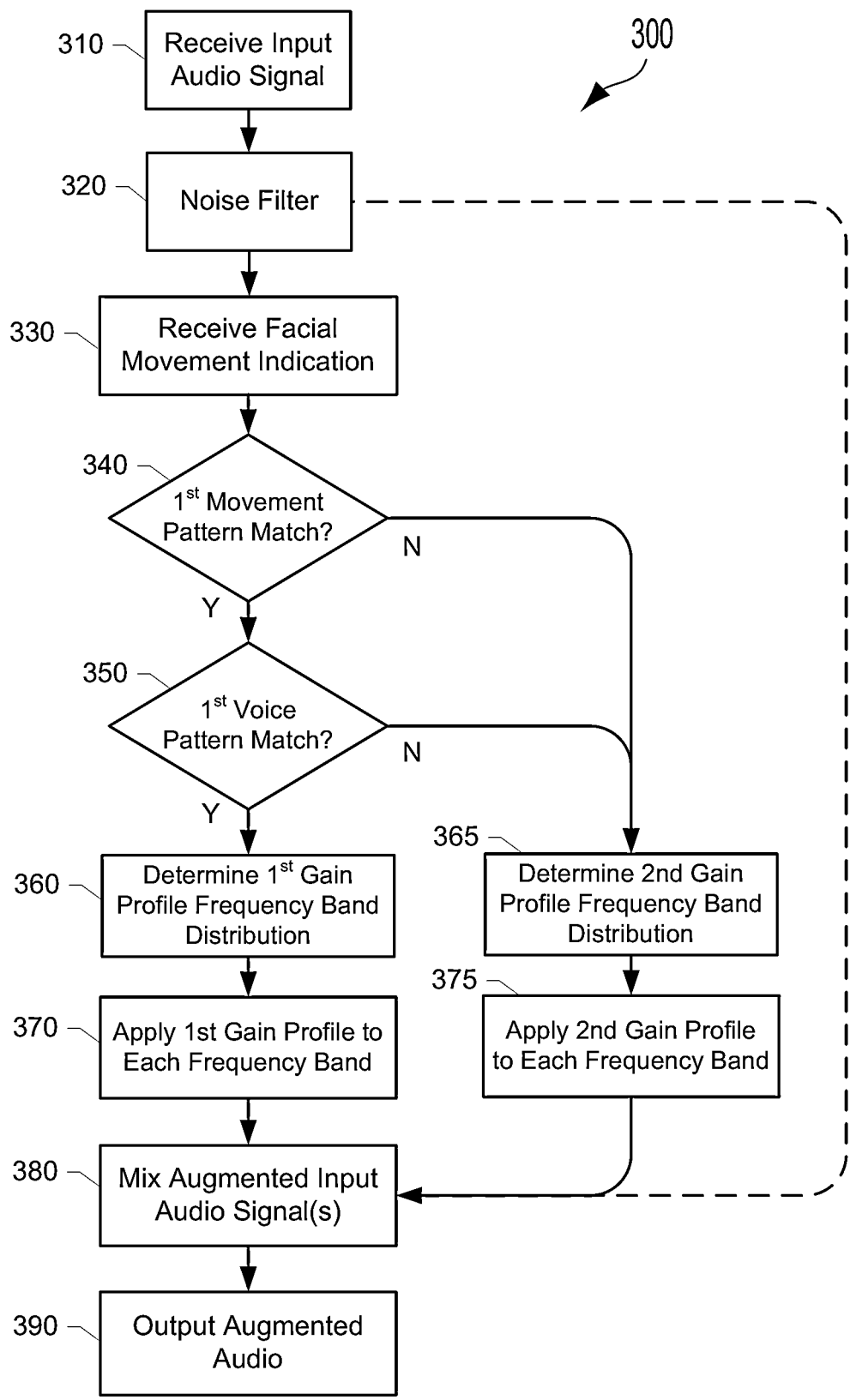
FIG. 6 illustrates a process flow diagram suitable for use in the various embodiments.

FIG. 6 illustrates a process flow of an embodiment method of controlling 300 the output of a hearing aid worn by a wearer. In an embodiment, the operations of method 300 may be performed by a processor of a hearing aid. In block 310 an input audio signal is received. The input audio signal may represent sounds heard by the hearing aid wearer. Those sounds may or may not include sounds generated by the wearer's own speech. In block 320 the input audio signal may be filtered to remove noise and/or easily defined segments for which the main gain profiles need not be applied. In block 330 a facial movement indication may be received from a facial movement detector, measured contemporaneously with the input audio signal. A received facial movement indication may include an unprocessed signal from the facial movement detector (which may be received along with other unprocessed signals) that is later confirmed and/or determined (after analysis by a signal processor) to represent a facial movement pattern associated with a wearer speaking (e.g., muscle activity analyzer 240). The other unprocessed signals may be ones not determined to be associated with a wearer speaking. Thus, the facial movement detector may detect various movements, not all of which are eventually determined to be associated with the wearer speaking. In block 340, a determination may be made as to whether the facial movement indication is a movement match of a first movement pattern associated with the wearer speaking. The first movement pattern may be one of many movement patterns associated with human speech or more specifically with the speech of the hearing aid wearer. Additionally, the determination as to whether a measured movement pattern is a match may be also or alternatively based on other wearer activity associated with the wearer speaking that is not a pattern of movement. Such "other wearer activity" may include natural reactions that occur while a person is speaking. For example, biological/chemical changes in the wearer's skin or other bio-indicators associated with a wearer speaking may be used, particularly those measureable/detectable from/through a wearer's skin. If the processor determines that the facial movement indication is a match to the first movement pattern associated with the wearer speaking (i.e., determination block 340 is "Yes"), a first gain profile may be applied to the contemporaneous portion(s) of the input audio signal. If the processor determines that the facial movement indication does not match the first movement pattern associated with the wearer speaking (i.e., determination block 340 is "No"), a second gain profile may be applied. In order to more accurately identify facial movements correlated to the wearer actually speaking, in determination block 350 a further determination may be made. In particular, determination block 350 the hearing aid processor may determine whether at least a portion of the input audio signal is an audio match to a first voice pattern associated with speech generated by the wearer. If the processor determines that at least a portion of the input audio signal is an audio match to a first voice pattern associated with speech generated by the wearer (i.e., determination block 350 is "Yes"), this may be a confirmation that the first gain profile should be applied to the contemporaneous portion(s) of the input audio signal (see block 370). However, if the processor determines that at least a portion of the input audio signal is not an audio match to a first voice pattern associated with speech generated by the wearer (i.e., determination block 350 is "No"), a second gain profile may be applied (see block 375).

In an embodiment, the method 300 may optionally further discriminate gain profile frequency band distributions based on separate and distinct frequency band ranges. Thus, in block 360 a first gain profile frequency band distribution may be determined. For example, the input audio signal may be divided into multiple frequency bands, such as under 500 Hz, 500 Hz to under 1 kHz, 1 kHz to under 2 kHz, 2 kHz to under 4 kHz, and 4 kHz to 8 kHz (as illustrated in FIG. 5). In this way, a first frequency-dependent gain distribution may be customized for each of the frequency bands in the first gain profile frequency band distribution. Similarly, in block 365 a first gain profile frequency band distribution may be determined. In this way, a second frequency-dependent gain distribution may be customized for each of the frequency bands in the second gain profile frequency band distribution. The second gain profile frequency band distribution may be similar or the same as the first gain profile frequency band distribution or it may have a different distribution. However, if the frequency band distribution determination(s) are not made, the determined gain profile may be applied in block 370 or block 375, depending upon the gain profile that is to be applied. Once the determined gain profile is applied in block 370 or 375, the mixer may combine the augmented input audio signals in block 380 and a mixed augmented audio segment may be output in block 390.

Figure 7A:
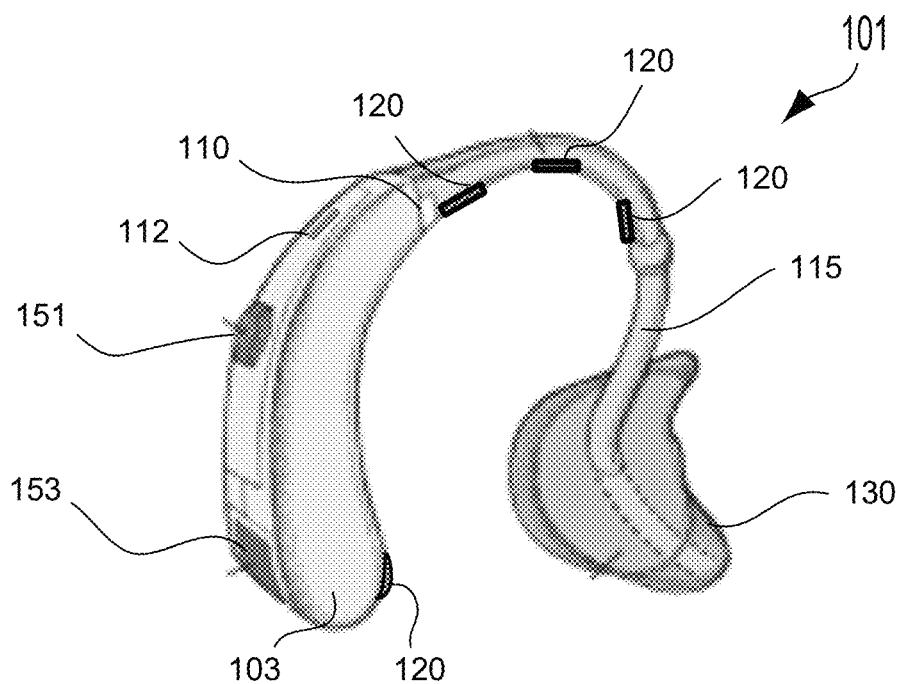
FIG. 7A illustrates a side view of a hearing aid suitable for the various embodiments worn by a wearer.
Figure 7B:
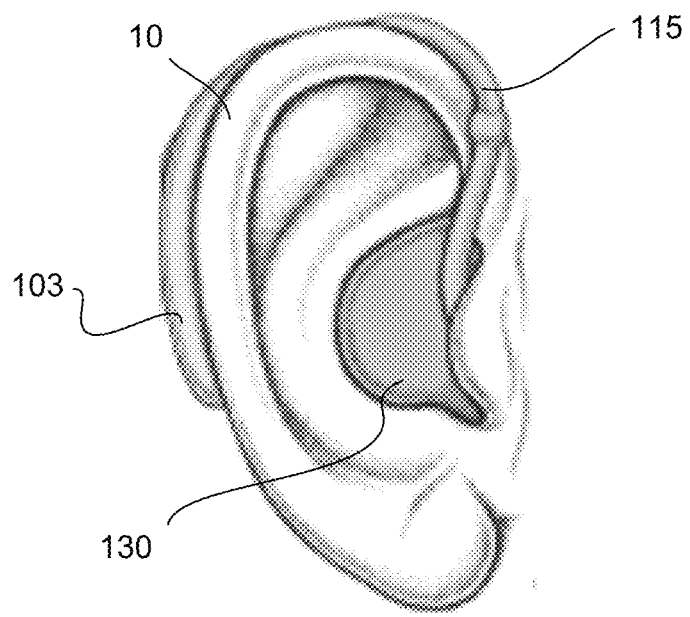
FIG. 7B illustrates a perspective view of the hearing aid of FIG. 7A alone.

FIG. 7A illustrates an embodiment hearing aid 101 including a housing 103, two microphones 110, 112, an ear hook 115, multiple facial movement detectors 120 (four are shown) and a speaker 130. The facial movement detectors 120 may be arranged around the ear hook 115 to ensure contact with skin covering one or more bony structures and/or facial muscles of the wearer, such as around the base of the ear, for detecting the wearer's own speech. FIG. 7B illustrates the hearing aid 101 worn by a wearer on the externally protruding parts of the ear 10. When worn by the hearing aid wearer, a first hearing aid microphone 110 may be configured to be facing toward the wearer's mouth, while a second hearing aid microphone 112 may be facing outwardly. In this way, the first microphone 100 may be used primarily to detect the wearer's own speech. Such a first microphone 110 may be unidirectional, while the second microphone 112 may be omni-directional for collecting a broader range of ambient sounds. Also, a differential between the first microphone 110 and the second microphone 112 may be used to determine a dominant direction of the ambient noise being picked-up by the microphones. For example, a first gain profile may be applied in response to determining that a threshold portion of the input audio signal was received from the first microphone, while a second gain profile may be applied if that threshold portion was not received by the first microphone. The threshold portion may be greater than fifty percent or some other percentage determined to reliably identify a dominant direction of the ambient noise being picked-up by the microphones. The multiple facial movement detectors 120 may provide redundancy in case any one of them fails to detect facial movements. The hearing aid 101 may further include input mechanisms 151, 153 (in the form of an activation button and/or toggle switch) for manual mode selections, in order to allow the wearer to control which mode is used. In this way, a processor of the hearing aid may receive a selection input when an input mechanism 151, 153 is used. In this way, such a selection input may indicate whether a particular gain profile should be applied or used. For example, the wearer may optionally override the gain profile determinations noted above by pressing the input button 151. Additionally, one or both of the input mechanisms 151, 153 may control the setup of the hearing aid, such as when the wearer's own voice needs to be recorded for calibration of the above-noted profiles. For example, the input mechanism 153 may be used to start and stop the recording of the wearer's own voice. It should be understood that the hearing aids of the various embodiments may include a power source, such as batteries.

The hearing aid processor(s) may be configured with processor-executable instructions to receive inputs from the microphones, facial movement detectors and input mechanism(s), as well as generate outputs from the speaker. The sensors, such as microphones, facial movement detectors and input mechanism(s) may be used as means for receiving signals and/or indications. The processor(s) may be used as means for determining conditions/triggers, such as whether patterns match or as means for applying a select gain profile. Also, the speaker and/or related hardware may be used as means for outputting. The processor may be coupled to one or more internal memories. Internal memories may be volatile or non-volatile memories, and may also be secure and/or encrypted memories, or unsecure and/or unencrypted memories, or any combination thereof. The processor may be any programmable microprocessor, microcomputer or multiple processor chip or chips that can be configured by software instructions (i.e., applications) to perform a variety of functions, including the functions of the various aspects described above. Multiple processors may be provided, such as one processor dedicated to one or more functions and another one or more processors dedicated to running other applications/functions. Typically, software applications may be stored in the internal memory before they are accessed and loaded into the processor. The processor may include internal memory sufficient to store the application software instructions. In many devices the internal memory may be a volatile or non-volatile memory, such as flash memory, or a mixture of both. For the purposes of this description, a general reference to memory refers to memory accessible by the processor including internal memory or removable memory plugged into the hearing aid and memory within the processor.

The processors in the various embodiments described herein may be any programmable microprocessor, microcomputer or multiple processor chip or chips that can be configured by software instructions (applications/programs) to perform a variety of functions, including the functions of the various embodiments described above. Typically, software applications may be stored in the internal memory before they are accessed and loaded into the processors. The processors may include internal memory sufficient to store the processor-executable software instructions. In many devices the internal memory may be a volatile or nonvolatile memory, such as flash memory, or a mixture of both. For the purposes of this description, a general reference to memory refers to memory accessible by the processors including internal memory or removable memory plugged into the device and memory within the processor themselves.

In one or more exemplary embodiments, the functions described may be implemented in hardware, software, firmware, or any combination thereof. If implemented in software, the functions may be stored as one or more instructions or code on a non-transitory computer readable storage medium or non-transitory processor-readable storage medium. The steps of a method or algorithm may be embodied in a processor-executable software module which may reside on a non-transitory computer readable or processor-readable storage medium. Non-transitory computer readable or processor-readable storage media may be any storage media that may be accessed by a computer or a processor. By way of example but not limitation, such non-transitory computer readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer readable and processor-readable media. Additionally, the operations of a method or algorithm may reside as one or any combination or set of codes and/or instructions on a non-transitory processor-readable medium and/or computer readable medium, which may be incorporated into a computer program product.

The foregoing method descriptions and the process flow diagrams are provided merely as illustrative examples and are not intended to require or imply that the blocks of the various embodiments must be performed in the order presented. As will be appreciated by one of skill in the art the order of blocks in the foregoing embodiments may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular. Additionally, as used herein and particularly in the claims, "comprising" has an open-ended meaning, such that one or more additional unspecified elements, steps and aspects may be further included and/or present.

The various illustrative logical blocks, modules, circuits, and process flow diagram blocks described in connection with the embodiments may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method of controlling an output of a wearable device worn by a wearer, comprising:
   receiving a facial movement indication from a facial movement detector measured contemporaneously with an input audio signal;
   determining whether the facial movement indication matches a first movement pattern associated with the wearer speaking;
   applying a speaking gain profile to the input audio signal for generating an augmented audio segment in response to determining that the facial movement indication matches the first movement pattern associated with the wearer speaking; and
   outputting the augmented audio segment.

2. The method of claim 1, further comprising:
   determining whether at least a portion of the input audio signal matches a first voice pattern associated with speech by the wearer, wherein applying the speaking gain profile is further in response to determining that the input audio signal matches the first voice pattern.

3. The method of claim 1, further comprising:
   applying a non-speaking gain profile to the input audio signal for generating the augmented audio segment in response to determining that the input audio signal does not match a first voice pattern.

4. The method of claim 1, wherein the facial movement detector is configured on the wearable device to engage skin of the wearer.

5. The method of claim 1, wherein the wearable device includes a first microphone and a second microphone separate from the first microphone, wherein the speaking gain profile is applied in response to determining that a threshold portion of the input audio signal was received from the first microphone.

6. The method of claim 1, wherein the speaking gain profile applies a first set of gain values to multiple frequencies of the input audio signal, the first set of gain values based on a first frequency-dependent gain distribution of the wearer while the wearer is speaking.

7. The method of claim 1, further comprising:
   applying a non-speaking gain profile to the input audio signal for generating the augmented audio segment in response to determining the facial movement indication does not match the first movement pattern associated with the wearer speaking, wherein the non-speaking gain profile applies a second set of gain values to multiple frequencies of the input audio signal, the second set of gain values based on a second frequency-dependent gain distribution of the wearer while the wearer is not speaking.

8. The method of claim 1, further comprising:
   determining whether the facial movement indication matches other wearer activity associated with the wearer speaking that is not a pattern of movement, wherein the speaking gain profile is applied to the input audio signal for generating the augmented audio segment in response to determining that the facial movement indication includes the other wearer activity.

9. The method of claim 1, further comprising:
   receiving a selection input indicating whether the speaking gain profile should be applied, wherein the speaking gain profile is applied to the input audio signal in response to the selection input indicating the speaking gain profile should be applied.

10. The method of claim 1, further comprising:
    determining a first voice pattern associated with speech by the wearer in response to receiving a setup input.

11. The method of claim 10, further comprising:
    receiving a start recording input from an input mechanism configured to initiate a voice recording of the wearer used for determining the first voice pattern.

12. A wearable device for adjusting sound heard by a wearer, comprising:
    a facial movement detector configured to detect facial movements of the wearer;
    a speaker for outputting an augmented audio segment;
    a memory having stored thereon first movement pattern data associated with the wearer speaking; and
    a processor coupled to the facial movement detector, the speaker and the memory, wherein the processor is configured with processor-executable instructions to perform operations comprising:
       receiving a facial movement indication from the facial movement detector measured contemporaneously with an input audio signal;
       determining whether the facial movement indication matches the first movement pattern;
       applying a speaking gain profile to the input audio signal for generating the augmented audio segment in response to determining that the facial movement indication matches the first movement pattern; and
       outputting the augmented audio segment to the speaker.

13. The wearable device of claim 12, wherein the processor is configured with the processor-executable instructions to perform operations further comprising:
    determining whether at least a portion of the input audio signal matches a first voice pattern associated with speech by the wearer, wherein applying the speaking gain profile is further in response to determining that the input audio signal matches the first voice pattern.

14. The wearable device of claim 12, wherein the processor is configured with the processor-executable instructions to perform operations such that the facial movement detector is an electromyography sensor.

15. The wearable device of claim 12, wherein the processor is configured with the processor-executable instructions to perform operations further comprising:
    applying a non-speaking gain profile to the input audio signal for generating the augmented audio segment in response to determining that the input audio signal does not match a first voice pattern.

16. The wearable device of claim 12, wherein the processor is configured with the processor-executable instructions to perform operations such that the wearable device includes a first microphone and a second microphone separate from the first microphone, wherein the speaking gain profile is applied in response to determining that a threshold portion of the input audio signal was received from the first microphone.

17. The wearable device of claim 12, wherein the processor is configured with the processor-executable instructions to perform operations such that the speaking gain profile applies a first set of gain values to multiple frequencies of the input audio signal, the first set of gain values based on a first frequency-dependent gain distribution of the wearer while the wearer is speaking.

18. The wearable device of claim 12, wherein the processor is configured with the processor-executable instructions to perform operations further comprising:
    applying a non-speaking gain profile to the input audio signal for generating the augmented audio segment in response to determining the facial movement indication does not match the first movement pattern associated with the wearer speaking, such that the non-speaking gain profile applies a second set of gain values to multiple frequencies of the input audio signal, the second set of gain values based on a second frequency-dependent gain distribution of the wearer while the wearer is not speaking.

19. The wearable device of claim 12, wherein the processor is configured with the processor-executable instructions to perform operations further comprising:
determining whether the facial movement indication matches other wearer activity associated with the wearer speaking that is not a pattern of movement, wherein the speaking gain profile is applied to the input audio signal for generating the augmented audio segment in response to determining that the facial movement indication includes the other wearer activity.

20. The wearable device of claim 12, wherein the processor is configured with the processor-executable instructions to perform operations further comprising:
receiving a selection input indicating whether the speaking gain profile should be applied, wherein the speaking gain profile is applied to the input audio signal in response to the selection input indicating the speaking gain profile should be applied.

21. The wearable device of claim 12, wherein the processor is configured with the processor-executable instructions to perform operations further comprising:
determining a first voice pattern associated with speech by the wearer in response to receiving a setup input.

22. The wearable device of claim 21, further comprising:
an input mechanism configured to receive a start recording input for initiating a voice recording of the wearer used for determining the first voice pattern.

23. A wearable device for adjusting sound heard by a wearer, comprising:
means for detecting a facial movement contemporaneously with an input audio signal;
means for determining whether detected facial movement matches a first movement pattern associated with the wearer speaking;
means for applying a speaking gain profile to the input audio signal for generating an augmented audio segment in response to determining that the detected facial movement matches the first movement pattern associated with the wearer speaking; and
means for outputting the augmented audio segment.

24. The wearable device of claim 23, further comprising:
means for determining whether at least a portion of the input audio signal matches a first voice pattern associated with speech by the wearer, wherein applying the speaking gain profile is further in response to determining that the input audio signal matches the first voice pattern.

25. The wearable device of claim 23, further comprising:
means for applying a non-speaking gain profile to the input audio signal for generating the augmented audio segment in response to determining that the input audio signal does not match a first voice pattern.

26. The wearable device of claim 23, further comprising:
means for applying a non-speaking gain profile to the input audio signal for generating the augmented audio segment in response to determining the facial movement does not match the first movement pattern associated with the wearer speaking, wherein the non-speaking gain profile applies a second set of gain values to multiple frequencies of the input audio signal, the second set of gain values based on a second frequency-dependent gain distribution of the wearer while the wearer is not speaking.

27. The wearable device of claim 23, further comprising:
means for determining whether the facial movement matches other wearer activity associated with the wearer speaking that is not a pattern of movement, wherein the speaking gain profile is applied to the input audio signal for generating the augmented audio segment in response to determining that the facial movement includes the other wearer activity.

28. The wearable device of claim 23, further comprising:
means for receiving a selection input indicating whether the speaking gain profile should be applied, wherein the speaking gain profile is applied to the input audio signal in response to the selection input indicating the speaking gain profile should be applied.

29. The wearable device of claim 23, further comprising:
means for receiving a start recording input configured to initiate a voice recording of the wearer; and
means for determining a first voice pattern associated with speech by the wearer from the voice recording.

30. A non-transitory computer readable storage medium having stored thereon processor-executable instructions configured to cause a processor of a wearable device worn by a wearer to perform operations for controlling an output of the wearable device, the operations comprising:
receiving a facial movement indication from a facial movement detector measured contemporaneously with an input audio signal;
determining whether the facial movement indication matches a first movement pattern associated with the wearer speaking;
applying a speaking gain profile to the input audio signal for generating an augmented audio segment in response to determining that the facial movement indication matches the first movement pattern associated with the wearer speaking; and
outputting the augmented audio segment.

* * * * *